(12) United States Patent
Nazari et al.

(10) Patent No.: US 6,888,897 B1
(45) Date of Patent: May 3, 2005

(54) MULTI-MODE ITERATIVE DETECTOR

(75) Inventors: Nersi Nazari, Cupertino, CA (US); Zining Wu, Los Altos, CA (US); Greg Burd, San Jose, CA (US)

(73) Assignee: Marvell International Ltd., Hamilton (BM)

( * ) Notice: Subject to any disclaimer, the term of this patent is extended or adjusted under 35 U.S.C. 154(b) by 0 days.

(21) Appl. No.: 09/559,186

(22) Filed: Apr. 27, 2000

(51) Int. Cl.$^7$ ............................. H04L 23/02; H09L 5/12
(52) U.S. Cl. ....................... 375/262; 375/341; 714/752; 714/758
(58) Field of Search ................................. 375/262, 264, 375/224, 340, 341; 714/786, 795, 752–758

(56) References Cited

U.S. PATENT DOCUMENTS

| | | | |
|---|---|---|---|
| 4,295,218 A | 10/1981 | Tanner | 371/40 |
| 5,933,462 A | 8/1999 | Viterbi et al. | 375/341 |
| 5,983,385 A | * 11/1999 | Khayrallah et al. | 714/755 |
| 6,009,549 A | 12/1999 | Bliss et al. | 714/769 |
| 6,028,728 A | 2/2000 | Reed | 360/51 |

FOREIGN PATENT DOCUMENTS

| | | |
|---|---|---|
| WO | WO 96/37050 | 11/1996 |
| WO | WO 00/19616 A2 | 4/2000 |

OTHER PUBLICATIONS

U.S. Appl. No. 09/730,597, Burd et al., filed Dec. 7, 2000.
U.S. Appl. No. 09/730,752, Burd et al., filed Dec. 7, 2000.
U.S. Appl. No. 09/730,603, Wu et al., filed Dec. 7, 2000.
U.S. Appl. No. 09/730,598, Wu et al., filed Dec. 7, 2000.
U.S. Appl. No. 09/901,507, Wu et al., filed Jul. 9, 2001.
"Low Density Parity–Check Codes", R.G. Gallager, 1963.
"Good Error–Correcting Codes Based On Very Sparse Matrices", D.J.C. MacKay, IEEE Transactions On Information Theory, vol. 45, No. 2, Mar. 1999.
"An Intuitive Justification And A Simplified Implementation Of The Map Decoder For Convolutional Codes", A.J. Viterbi, IEEE Journal On Selected Areas In Communications, vol. 16, No. 2, Feb. 1998.

* cited by examiner

Primary Examiner—Stephen Chin
Assistant Examiner—Curtis Odom

(57) ABSTRACT

A transmitter is provided for transmitting data to a communication channel and a receiver receives the data from the communication channel. The transmitter comprises an encoder to encode data and a linear block encoder to encode data encoded by the encoder. The receiver comprises a soft channel decoder to decode the data, and a soft linear block code decoder to decode data decoded by the soft channel decoder. In the first iteration, the soft channel decoder decodes data received by the receiver. In succeeding iterations, the soft channel decoder decodes the data received by the receiver and utilizes information from the soft linear block decoder from an immediate preceding iteration. A decision circuit selects an output of the soft linear block decoder if an evaluated criterion is less than a threshold, or an output of the soft channel decoder if the evaluated criterion is greater than the threshold. A decoder decodes an output of the threshold check circuit.

168 Claims, 10 Drawing Sheets

Analog Waveform

Digital Waveform

MULTI-MODE ITERATIVE DETECTOR

BACKGROUND OF THE INVENTION

1. Field of the Invention

This invention relates generally to an iterative decoder. More particularly, the present invention relates to an iterative decoder for application in either digital data transmission or digital data storage and a method embodied therein.

2. Description of the Related Art

FIG. 1 illustrates a conventional digital data transmission system. As shown therein a digital data transmission system comprises a transmitting section 300 for transmitting data to receiver 500 via communication channel 401. During the transmission operation shown in FIG. 2, the data is first encoded in a conventional manner by run length limited (RLL) encoder 302 or RLL encoder means, and parity bits are encoded by linear block code encoder 304 or linear block encoder means. The combined RLL encoded data and parity bits are then input to transmitter 306 or transmitting means for transmission as an analog, electrical signal over communication channel 401. Communication channel 401 may include any wireless, wire, optical and the like communication medium. Receiver 500 comprises an analog to digital converter 502 or analog to digital converting means to converts the data transmitted on communication channel 401 to a digital signal. The digital signal is input to soft channel decoder 504, which provides probability information of the detected data. Soft linear block code decoder 506 utilizes this information and the parity bits. Soft channel decoder 504 and soft linear block code decoder 506 operate in an iterative manner to decode the detected data.

Linear block codes are well known to those of ordinary skill in the art. One example of a linear block code is a low density parity check code (LDPC) which is discussed by Robert G. Gallager in *Low-Density Parity-Check Codes*, 1963, M.I.T. Press and by Zining Wu in *Coding and Iterative Detection For Magnetic Recording Channels*, 2000, Kluwer Academic Publishers, the contents of each of which are incorporated in their entirety by reference.

FIGS. 2a-2c shown a digital data storage system. As illustrated in FIG. 2a, hard disk drive 100 comprises a magnetic disk and head assembly 104 including a stack of several rigid magnetic disks 102 and several magnetic transducers positioned on a movable arm 105 for operable interaction with the magnetic recording surfaces on each disk. These magnetic heads slide or 'fly' in close proximity over the surfaces of the magnetic disks 102 to react to the changes in orientations of magnetic fields of tiny magnetic domains on the disks that represent the stored data. These interactions with magnetic fields produce electrical signals of constantly varying amplitudes that are pre-amplified to produce resulting analog waveforms 106, as shown in FIG. 2b, that are applied to a read-channel integrated circuit 109, as shown in FIG. 2c. The read channel integrated circuit 108 processes the waveform and produces data-representing signals having digital waveforms 110, as shown in FIG. 2d. The same integrated circuit 108 is also used during data-writing processes to transform user data in digital form to analog waveforms that are then recorded on a disk 102 via the associated magnetic transducer.

FIG. 3 illustrates typical flow of data signals during write operations by encoder 600 onto disk drive 400 and read operations by read channel 700 from disk drive 400. During the write operation shown in FIG. 3, the data is first encoded, similarly to the digital data transmission system described above, by run length limited (RLL) encoder 302, and parity bits are encoded by linear block code encoder 304. The combined RLL encoded data and parity bits are then input to current generator 402 or writing means for generating a current to drive write head 404. Write head 404 magnetizes disk 406 for storing the data signal thereon.

In the reading process, read head 408 detects and converts the data stored on disk 406 to an analog, electrical signal. The electrical signal is converted to a digital signal in read channel 700 by analog to digital converter 502. The digital signal is input to soft channel decoder 504. Soft linear block code decoder 506 utilizes this information and the parity bits. Soft channel decoder 504 and soft linear block code decoder 506 operate in an iterative manner to decode the detected data.

One disadvantage of the conventional iterative decoding approach is that, even though this approach produces robust gains in terms of bit error rate (BER), it is susceptible to large error bursts caused by an inability of the iterative algorithm to converge within the allowed number of iterations. To exacerbate this situation, erroneous bits at the output to iterative detector do not necessarily cluster together. As such, it is more difficult for the error correcting code (ECC) to properly perform its function. Additionally, when utilizing LDPC errors can propagate. In other words, wrong information may be passed along the decoding process.

OBJECTS OF THE INVENTION

Therefore, it is an object of the present invention to overcome the aforementioned problems.

It is another object of the present invention to improve the accuracy in decoding data from a communication channel.

It is a further object of the present invention to minimize the propagation of errors along the decoding process.

It is still yet an object of the present invention to provide a high performance iterative detector.

It is still yet another object of the present invention to improve the accuracy in decoding data read from a magnetic recording medium.

SUMMARY OF THE INVENTION

According to this invention, a storage system is provided for storing data on a storage medium and comprises an encoder to encode data. A linear block encoder encodes data encoded by the encoder. A write circuit writes the encoded data to the storage medium, and a read circuit reads data from the storage medium. A soft channel decoder decodes data, and a soft linear block code decoder then decodes data decoded by the soft channel decoder. In the first iteration, the soft channel decoder decodes data read by the read head. In succeeding iterations, the soft channel decoder decodes the data read by the read head and utilizes information from the soft linear block decoder from an immediate preceding iteration. A threshold check circuit selects an output of the soft linear block decoder if a number of parity-check violations are less than a threshold, or an output of the soft channel decoder if a number of violations is greater than the threshold. A decoder decodes an output of the threshold check circuit.

In accordance with a second aspect of the present invention, the encoder comprises a run length limited encoder and the decoder comprises a run length limited decoder.

In accordance with a third aspect of the present invention, the linear block code encoder comprises a low-density parity-check encoder and the soft linear block code decoder comprises a low-density parity-check decoder.

In accordance with a fourth aspect of the present invention, the soft channel decoder comprises a bi-directional Viterbi algorithm decoder.

In accordance with a fifth aspect of the present invention, if there is a parity-check violation at an output of the soft linear block code decoder, the soft channel decoder decodes the output of the soft linear block code decoder.

In accordance with a sixth aspect of the present invention, if there are no parity-check violations or a number of iterations exceed a predetermined number then the threshold check circuit determines if the number of parity-check violations is less than the threshold.

In accordance with a seventh aspect of the present invention, the predetermined number is five.

In accordance with a eighth aspect of the present invention, the threshold is 12.

In accordance with a ninth aspect of the present invention, the threshold is 8.

In accordance with a tenth aspect of the present invention, the soft linear block code decoder utilizes parity-check equations to determine if there is a parity-check violation.

In accordance with an eleventh aspect of the present invention, a data transmission system for transmitting data to and receiving data from a communication channel, is provided with an encoder to encode data, and a linear block encoder to encode data encoded by the encoder. A transmitter transmits an output of the linear block encoder to the communication channel, and a soft channel decoder decodes the data. A soft linear block code decoder to decode data decoded by the soft channel decoder. In a first iteration, the soft channel decoder decodes the data from the communication channel, and in a succeeding iteration, the soft channel decoder decodes the data read by the read circuit and utilizes information decoded by the soft linear block decoder from an immediately preceding iteration. A decision circuit selects an output of the soft linear block code decoder if an evaluated criterion is less than a threshold, or an output of the soft channel decoder if the evaluated criterion is greater than the threshold. A decoder to decode an output of the threshold check circuit.

In accordance with a twelfth aspect of the present invention, the encoder comprises a run length limited encoder and the decoder comprises a run length limited decoder.

In accordance with a thirteenth aspect of the present invention, the linear block code encoder comprises a low-density parity-check encoder and wherein the soft linear block code decoder comprises a low-density parity-check decoder.

In accordance with a fourteenth aspect of the present invention, the soft channel decoder comprises a bidirectional Viterbi algorithm decoder.

In accordance with a fifteenth aspect of the present invention, if the evaluated criterion is greater than a predetermined threshold, the soft channel decoder utilizes the information of the soft linear block code decoder.

In accordance with a sixteenth aspect of the present invention, if the evaluated criterion is satisfied or a number of iterations exceeds a predetermined number then the decision circuit determines if the evaluated criterion is greater than a predetermined threshold.

In accordance with a seventeenth aspect of the present invention, the predetermined number is five.

In accordance with a eighteenth aspect of the present invention, the evaluated criterion is selected from the group consisting of signal to noise ratio, such as can be estimated through metrics in a Viterbi detector, and parity check equations.

In accordance with a nineteenth aspect of the present invention, the evaluated criterion comprises parity check equations, and wherein the soft linear block code decoder utilizes a parity-check matrix to determine if there is a parity-check violation.

In accordance with a twentieth aspect of the present invention, a multiplexer is provided in communication with the encoder and the linear block encoder and provides an output to the transmitter.

Other objects and attainments together with a fuller understanding of the invention will become apparent and appreciated by referring to the following description and claims taken in conjunction with the accompanying drawings.

BRIEF DESCRIPTION OF THE DRAWINGS

In the drawings wherein like reference symbols refer to like parts.

FIG. 2b illustrates an analog waveform of data read from the hard disk drive of FIG. 1a;

DESCRIPTION OF THE PREFERRED EMBODIMENTS

Figure 1:
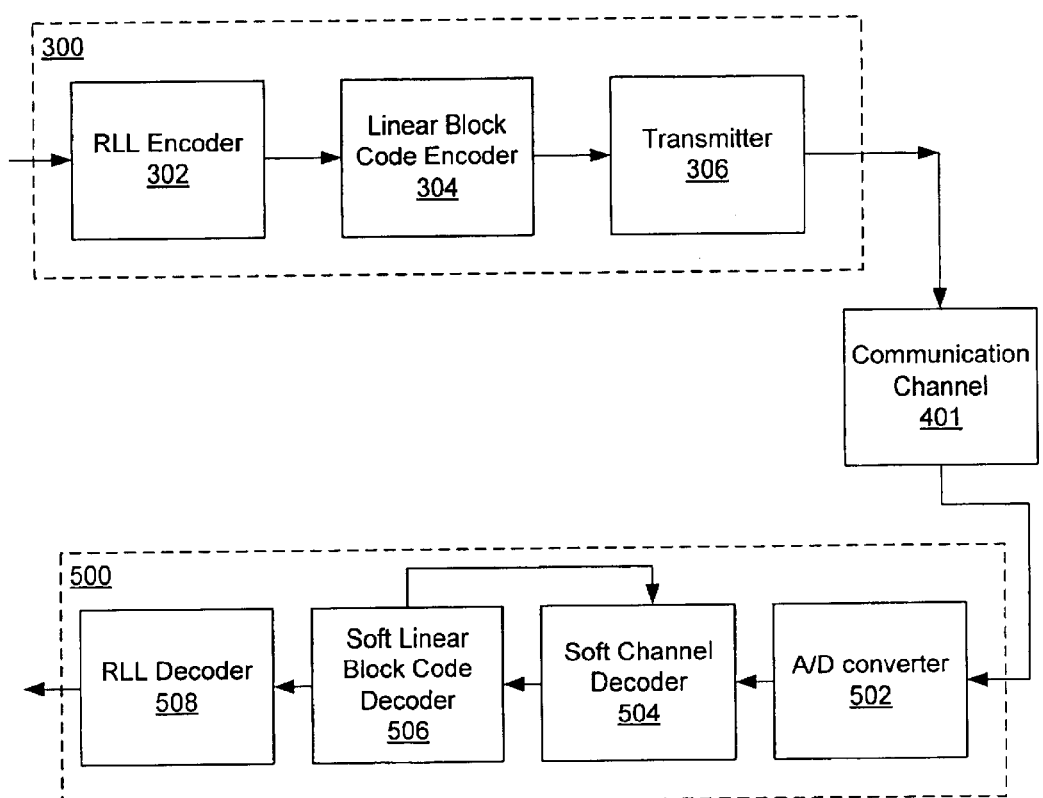
FIG. 1 is a general block diagram of a conventional digital data transmission system.
Figure 2A:
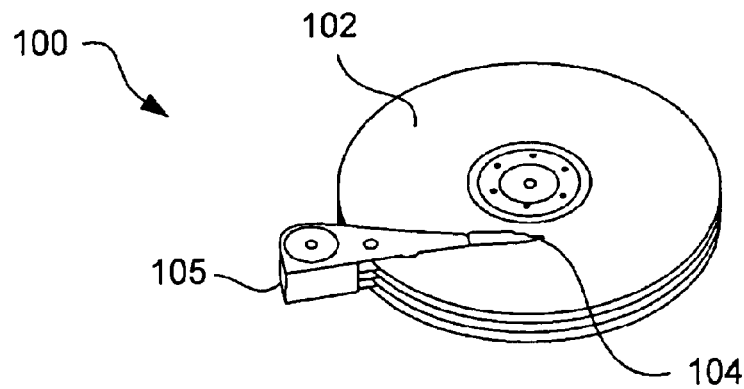
FIG. 2a is illustrative of the general architecture of a hard disk drive.
Figure 2B:
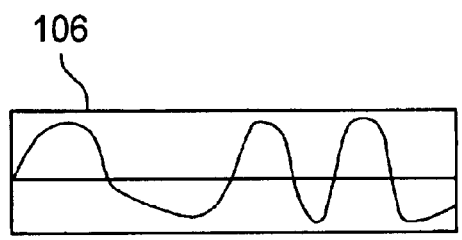
Figure 2C:
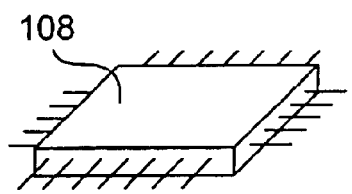
FIG. 2c illustrates a read-channel integrated circuit.
Figure 2D:
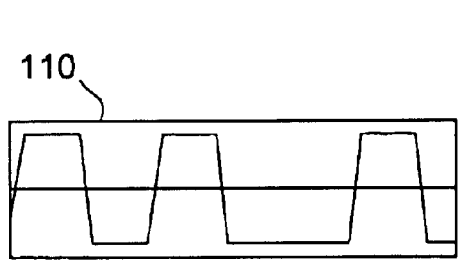
FIG. 2d illustrates a digitized waveform of the analog waveform of FIG. 1b.
Figure 4:
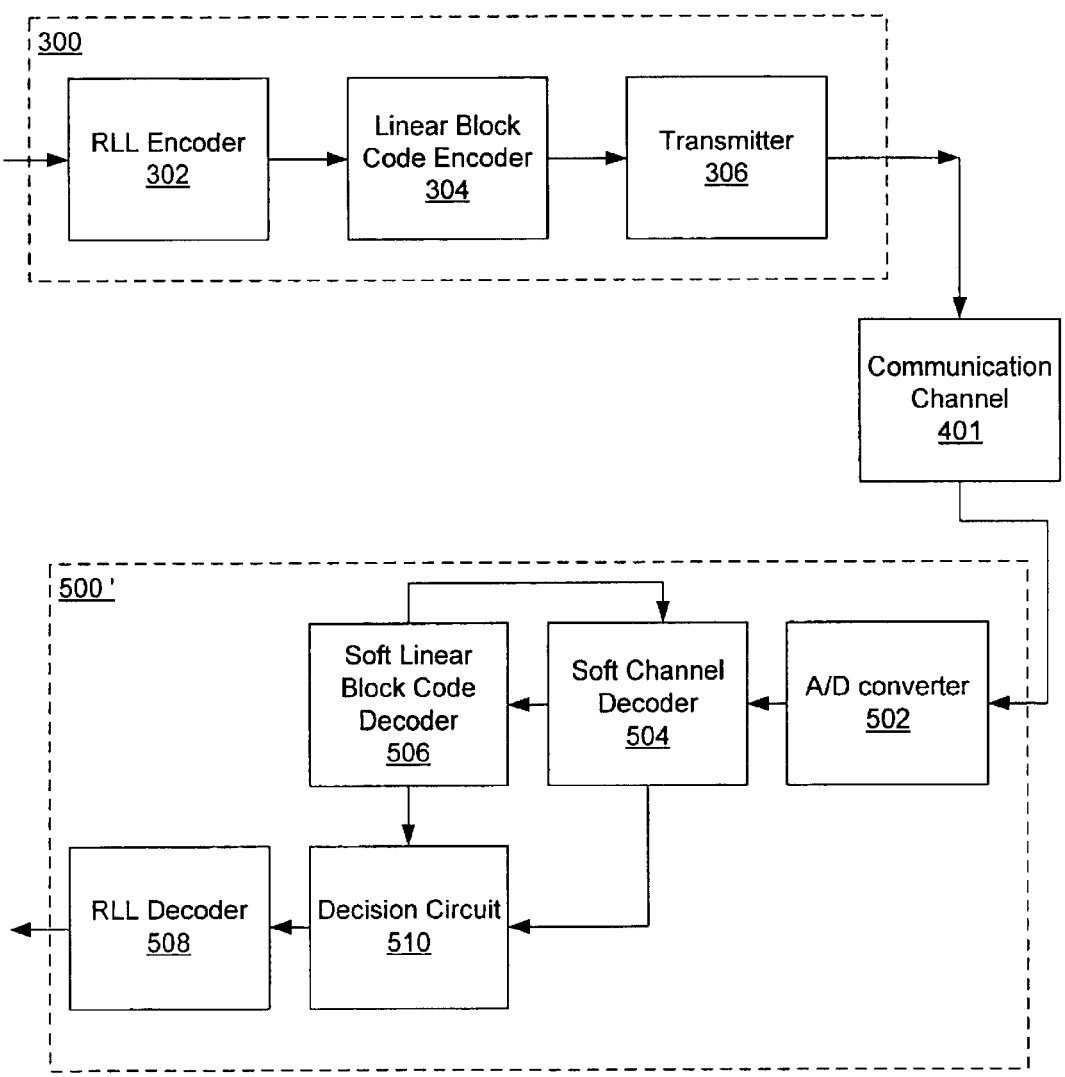
FIG. 4 is a general block diagram of a digital data transmission system in accordance with an embodiment of the present invention.

Reference is now made to FIG. 4. FIG. 4 illustrates typical flow of data signals during transmitting operations by transmitting section 300 via communication channel 401 to receiver 500' in accordance with an embodiment of the present invention. Communication channel may be implemented by any wired medium, wireless medium, optical medium and the like. Transmitting section 300 and communication channel 401 are similar to that shown in FIG. 1 and discussed above, thus no further explanation will be provided herein.

As shown in FIG. 4, receiver 500' comprises an analog to digital converter 502 to convert the analog signal from communication channel 401 into a digital signal. The digital signal is input to soft channel decoder 504 or soft channel decoding means, which provides probability information of the detected data. Soft linear block code decoder 506 or soft linear block code decoding means utilizes this estimate and the parity bits encoded in the signal to decode the detected data. Soft channel decoder 504 and soft linear block code decoder 506 operate in an iterative manner to decode the detected data.

In the first iteration (N=1), soft channel decoder 504 decodes data received from communication channel 401 which is converted to a digital signal by A/D converter 502. In succeeding iterations (N>1), soft channel decoder 504 decodes the data from communication channel 401 and utilizes information from soft linear block decoder 506 from an immediate preceding iteration (N−1).

The output of soft linear block code decoder 506 and the output of soft channel decoder 504 are evaluated in decision circuit 510 or decision means to determine select an output whether soft linear block code decoder 506 if an evaluated criterion have been met. Such criterion can include a comparison of the signal to noise ratio to a threshold value, such as can be estimated through metrics in a Viterbi detector, a comparison of the parity check equations and the like. The Viterbi detector is well know to those of ordinary skill in the art and no further discussion will be presented herein. As will be appreciated by one or ordinary skill in the art, any combination of the above-mentioned criteria my be utilized by decision circuit 510. Additionally, the decision circuit may be implemented employing weighting factors for each of such criteria.

The output of soft channel decoder 504 (corresponding to the first iteration) is selected if the evaluated criterion at the end of the last iteration is greater than the threshold. On the other hand, if the evaluated criterion is less than the threshold then the output of soft linear block code decoder 506 is selected. The output of decision circuit 510 is RLL decoded by RLL decoder 508 or RLL decoding means.

Figure 5:
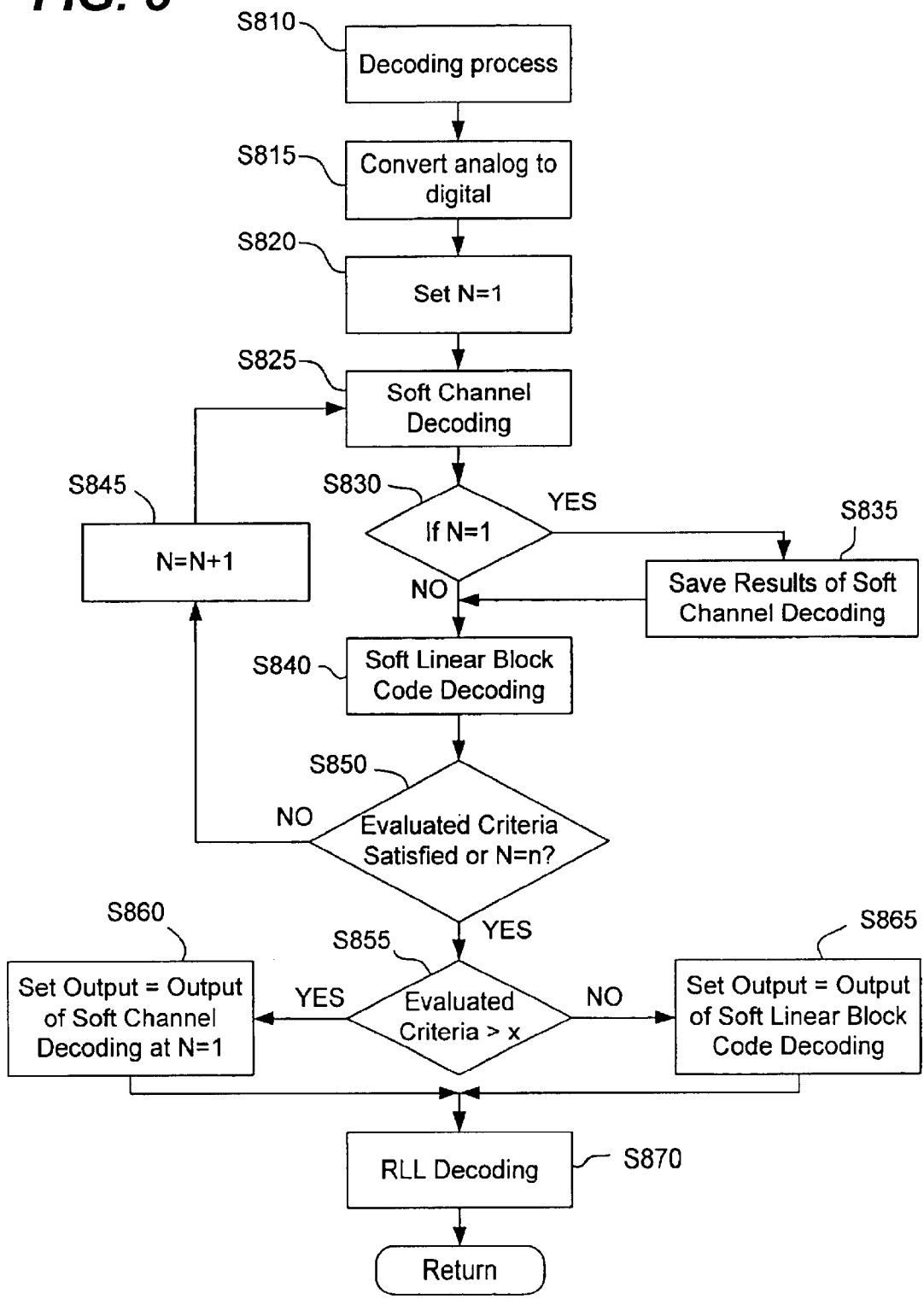
FIG. 5 is a flow chart of the process incorporated of the embodiment of FIG. 4.

FIG. 5 is a flowchart illustrating the operation of the receiver in FIG. 4. As noted above, the output of communication channel 401, which is an analog signal, is converted to a digital signal in step S815 by analog to digital decoder 502. The counter N is set to 1 in step S820. The digital signal is then soft channel decoded by soft channel decoder 504 in step S825. After the first soft channel decoding process the results are saved in a buffer memory, otherwise the results thereof are not saved (steps S830 and S840).

The results of the soft channel decoder 504 are then soft linear decoded by soft linear block code decoder 506, step S840. In step S850, decision circuit 510 determines if the evaluated criterion is satisfied. If the evaluated criterion is satisfied or if the number of iterations N is equal to n, then processing continues to step S855; otherwise N is incremented by 1 and the next iteration of processing is performed.

In step S855 decision circuit 510 determines if the evaluated criterion is greater than a predetermined threshold x. If the evaluated criterion is greater than x, then the output is set to the output of the soft channel decoder at N=1, which was previously saved in step S835. Alternatively, if the evaluated criterion is not greater than x, the output is set to the output of the soft linear block code decoding, step S865. The output is then RLL decoded in step S870.

Figure 3:
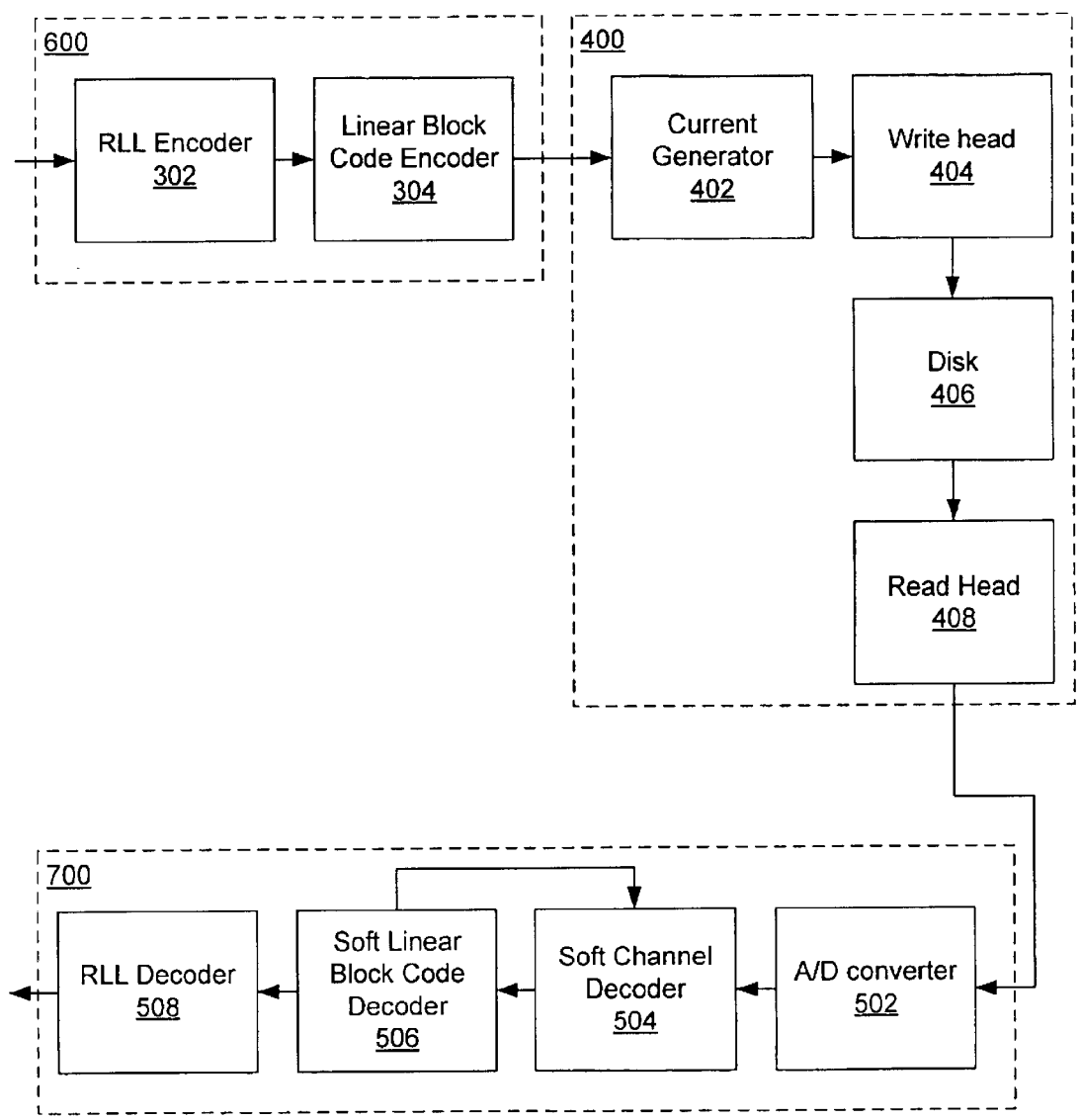
FIG. 3 is a block diagram of an encoder, hard disk drive and read channel having a conventional iterative decoder.
Figure 6:
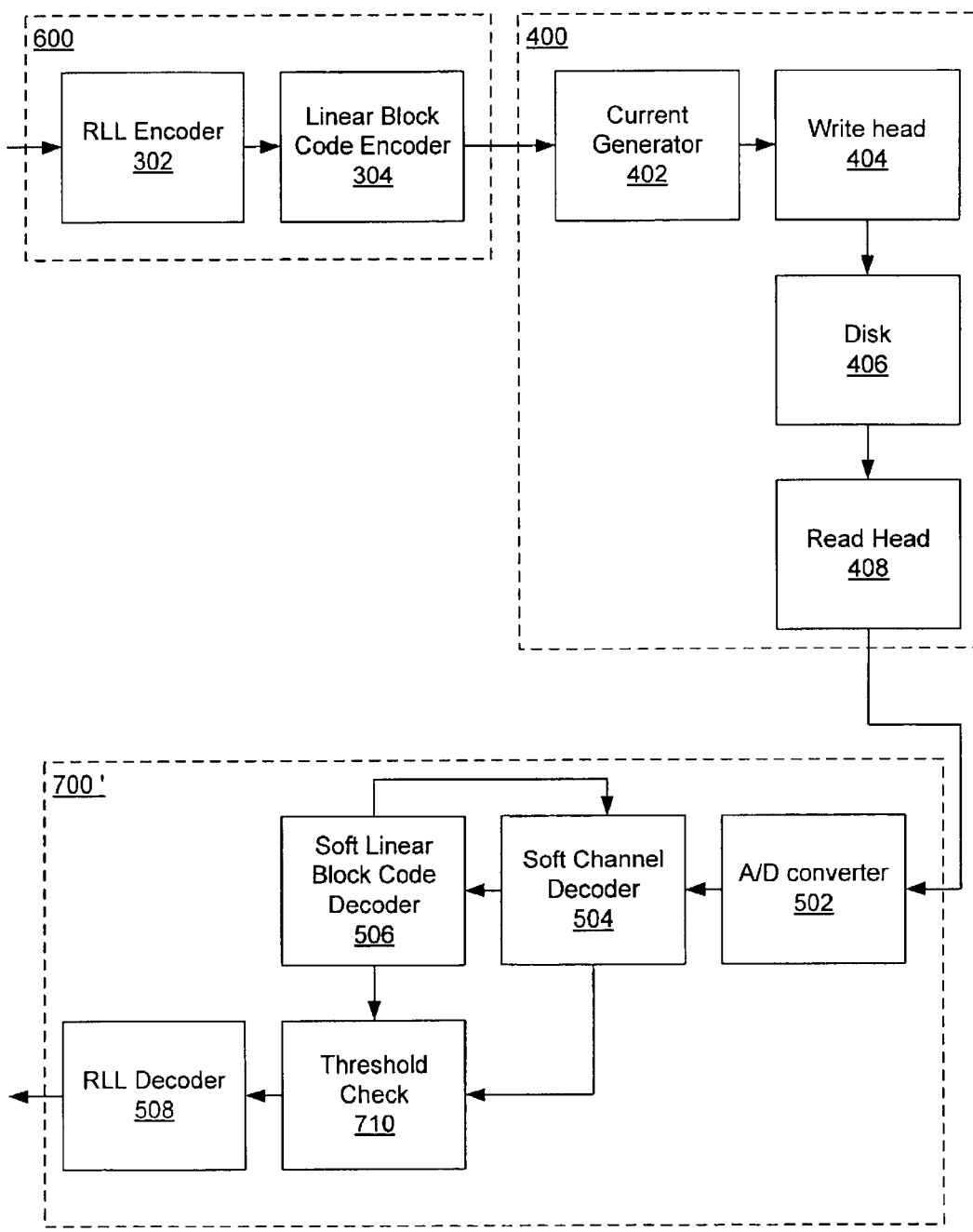
FIG. 6 is a block diagram of an encoder, hard disk drive and read channel having an iterative decoder in accordance with an embodiment of the present invention.

FIG. 6 illustrates the embodiment of the present invention when employed with a mass storage system. As will be appreciated by one of ordinary skill in the art, a mass storage system is just one specific example of a data transmission system. FIG. 6 illustrates typical flow of data signals during write operations by encoder 600 onto disk drive 400 and read operations by read channel 700' from disk drive 400. Encoder 600 and disk drive 400 are similar to that shown in FIG. 3 and discussed above, thus no further explanation will be provided herein.

As shown in FIG. 6, read channel 700' comprises an analog to digital converter 502 to convert the analog signal from read head 408 into a digital signal. The digital signal is input to soft channel decoder 504 or soft channel decoding means, which provides probability information of the detected data. Soft linear block code decoder 506 or soft linear block code decoding means utilizes this estimate and the parity bits encoded in the signal to decode the detected data. Soft channel decoder 504 and soft linear block code decoder 506 operate in an iterative manner to decode the detected data.

In the first iteration (N=1), soft channel decoder 504 decodes data read by read head 408 which is converted to a digital signal by A/D converter 502. In succeeding iterations (N>1), soft channel decoder decodes 504 the data read by the read head and utilizes information from soft linear block decoder 506 from an immediate preceding iteration (N−1).

The output of soft linear block code decoder 506 and the output of soft channel decoder 504 are evaluated in threshold check 710 or threshold determining means to determine whether soft linear block code decoder 506 has a number of parity check equation violations which exceed a threshold. The output of soft channel decoder 504 (corresponding to the first iteration) is selected if the number of parity check equations violated at the end of the last iteration is greater than the threshold. On the other hand, if the number of violations is less than the threshold then the output of soft linear block code decoder 506 is selected. The output of threshold check 710 is RLL decoded by RLL decoder 508 or RLL decoding means.

Figure 8:
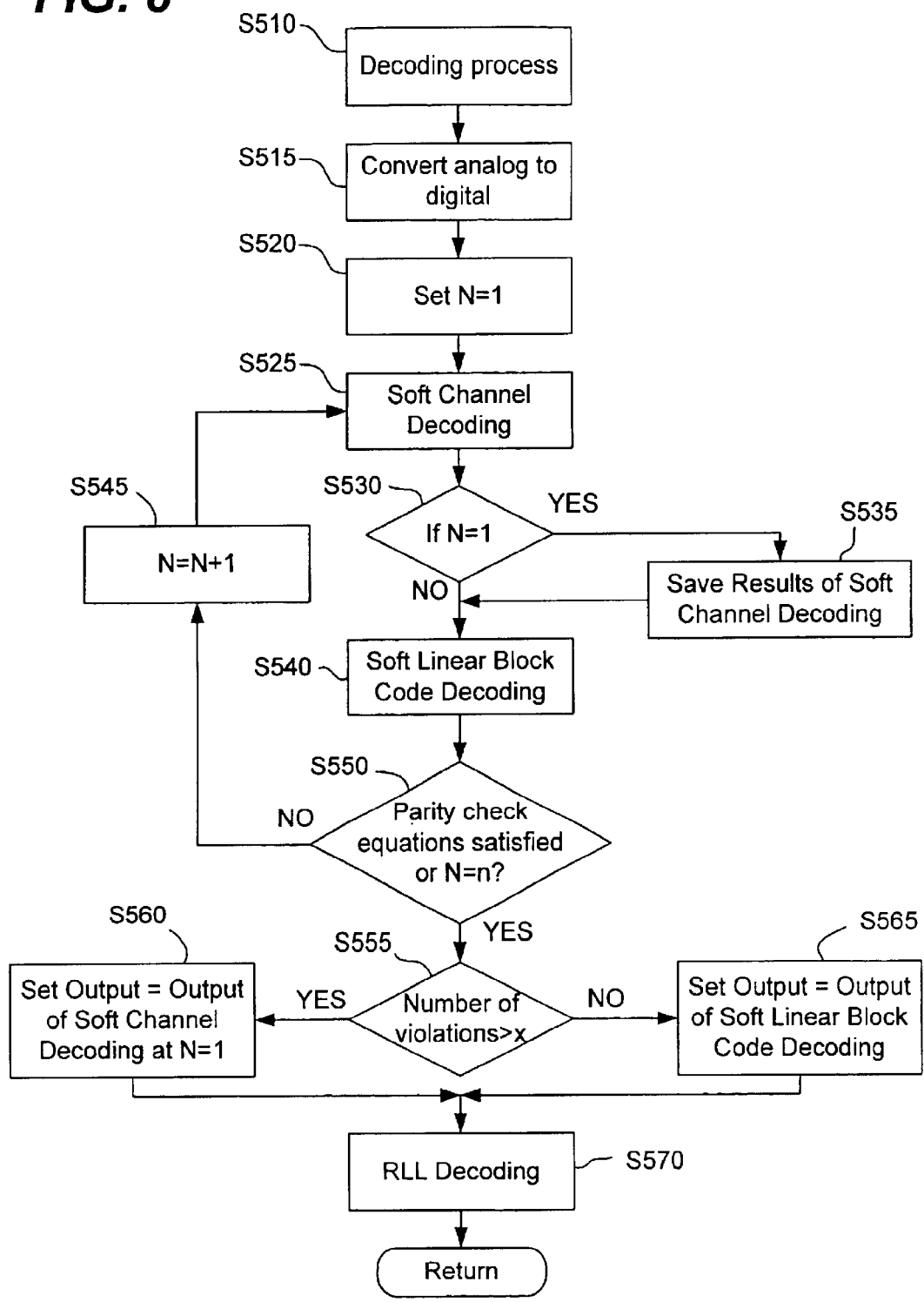
FIG. 8 is a flow chart of the process incorporated of the embodiment of FIG. 6.

FIG. 8 is a flowchart illustrating the operation of the read channel in FIG. 6. As noted above, the output of read head 408, which is an analog signal, is converted to a digital signal in step S515 by analog to digital decoder 502. The counter N is set to 1 in step S520. The digital signal is then soft channel decoded by soft channel decoder 504 in step S525. Examples of soft channel decoding include the bi-directional Viterbi algorithm (BIVA) and the Bahl-Cooke-Jelinek-Raviv (BCJR) algorithm. These algorithms are discussed by Zining Wu in *Coding and Iterative Detection For Magnetic Recording Channels*, 2000, Kluwer Academic Publishers. The bi-directional Viterbi algorithm is discussed by Shoemake and Heegard in *Computationally Efficient Turbo Decoding with Bi-directional Viterbi Algorithm* (BIVA), IEEE, ISIT 1997, the contents of which are incorporated herein by reference. After the first soft channel decoding process the results are saved in a buffer memory, otherwise the results thereof are not saved (steps S530 and S540).

The results of the soft channel decoder 504 are then soft linear decoded by soft linear block code decoder 506, step S540. An example of linear block decoding is low-density parity check code (LDPC) decoding. As noted above LDPC is discussed by Robert G. Gallager in *Low-Density Parity-Check Codes*, 1963, M.I.T. Press and by Zining Wu in *Coding and Iterative Detection For Magnetic Recording Channels*, 2000, Kiuwer Academic Publishers.

In step S550, the parity check equations are calculated to determine if there are any violations. If there are no violations or if the number of iterations N is equal to n, then processing continues to step S555; otherwise N is incremented by 1 and the next iteration of processing is performed.

In step S555 threshold detector 510 determines if the number of violations is greater than x. If the number of violations is greater than x, then the output is set to the output of the soft channel decoder at N=1, which was previously saved in step S535. Alternatively, if the number of violations is not greater than x, the output is set to the output of the soft linear block code decoding, step S565. The output is then RLL decoded in step S570.

An example of the parity check matrix having three parity equations (represented by the parity check matrix) and 7 bits (represented by the 7 element vector) is set forth in equation (1) below. In practice the number of parity equations is between 60 and 120 and the number of bits is between 1100 and 1300.

$$\begin{bmatrix} 1001011 \\ 0100111 \\ 0011101 \end{bmatrix} \times \begin{bmatrix} x1 \\ x2 \\ x3 \\ x4 \\ x5 \\ x6 \\ x7 \end{bmatrix} = \begin{bmatrix} 0 \\ 0 \\ 0 \end{bmatrix} \text{ modulo 2} \qquad (1)$$

Alternatively, the parity equations may be express as equations (2).

$$x_1 + x_4 + x_6 + x_7 = 0 \quad \text{modulo 2} \qquad (2)$$
$$x_2 + x_5 + x_6 + x_7 = 0 \quad \text{modulo 2}$$
$$x_3 + x_4 + x_5 + x_7 = 0 \quad \text{modulo 2}$$

When equation (1) is (or equations (2) are) satisfied, there are no parity violations and the data is valid. When equation (1) is (or any of equations (2) are) not satisfied the data is not valid.

An example of a parity check matrix equation with one violation is shown in equations (3)

$$x_1 + x_4 + x_6 + x_7 = 0 \quad \text{modulo 2} \qquad (3)$$
$$x_2 + x_5 + x_6 + x_7 = 1 \quad \text{modulo 2}$$
$$x_3 + x_4 + x_5 + x_7 = 0 \quad \text{modulo 2}$$

In step S550 if the number of violations is 0 or the number of iterations N =n, then processing proceeds to step to step S555. In step S555, the number of equations, which are violated, is determined. Processing then proceeds to step S570 as explained above.

Best Mode

Figure 7:
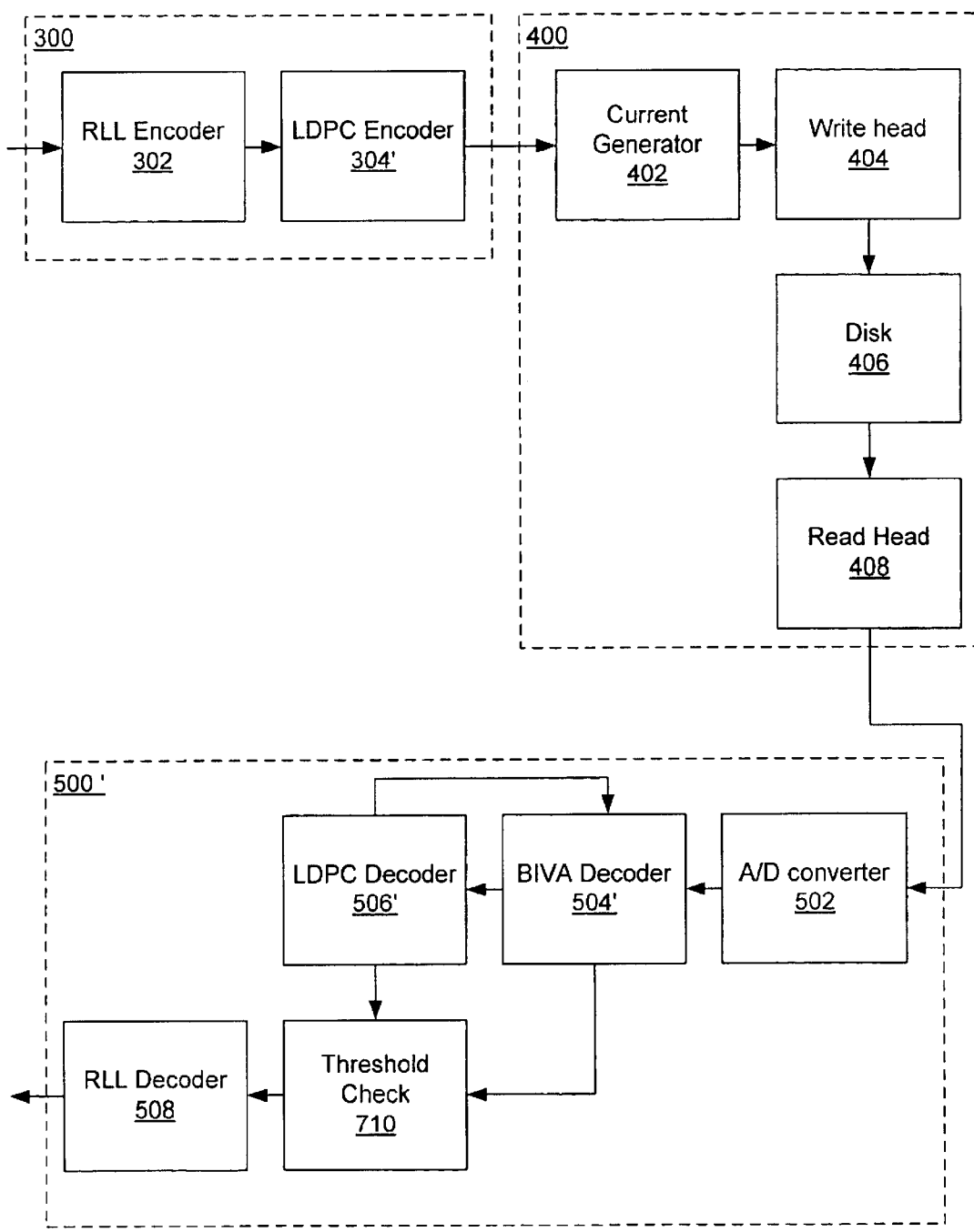
FIG. 7 is a block diagram of an encoder, hard disk drive and read channel having an iterative decoder in accordance with a preferred embodiment of the present invention.
Figure 9:
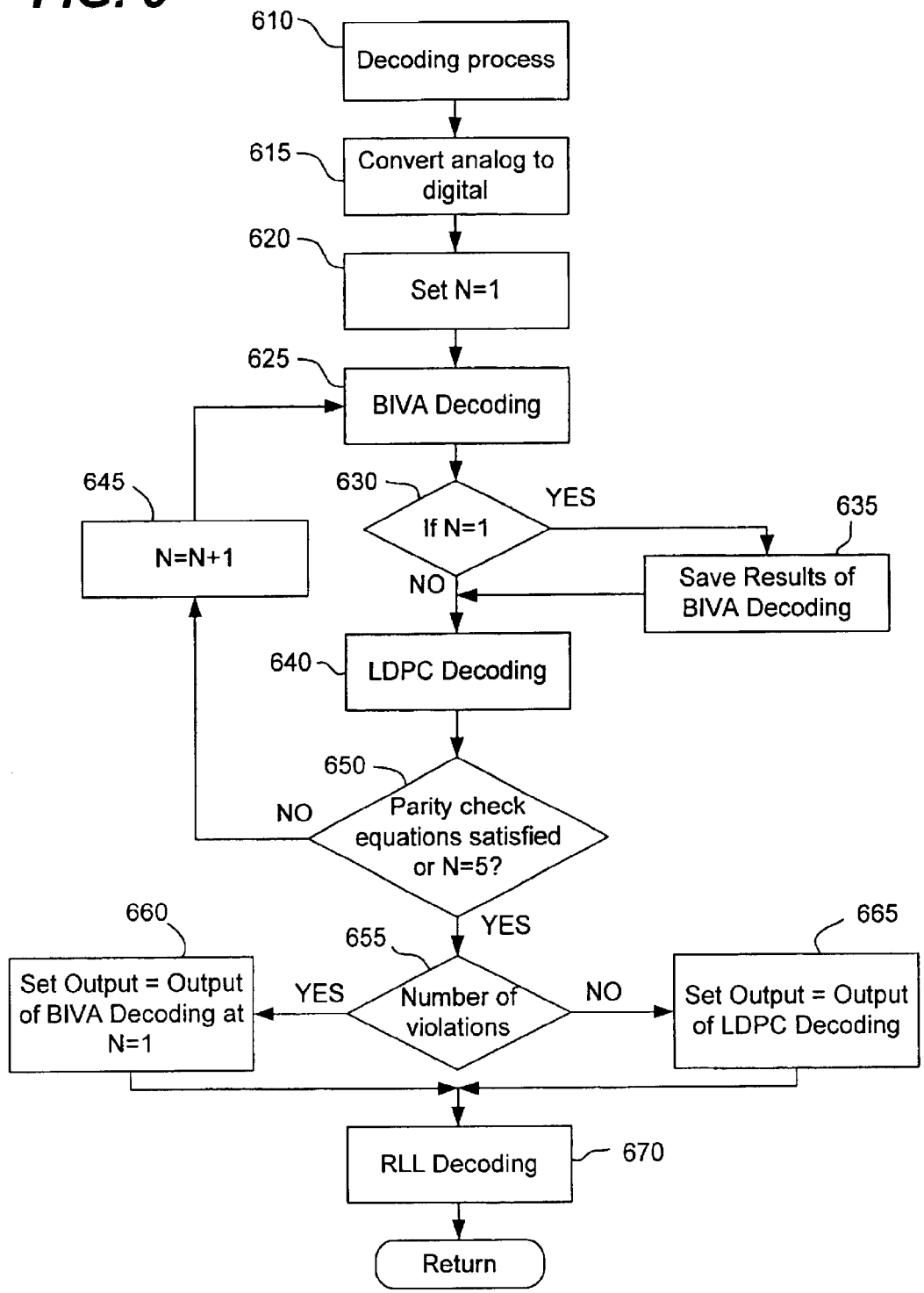
FIG. 9 is a flow chart of the process incorporated of the embodiment of FIG. 7.

FIG. 7 and FIG. 9 show the best mode of the preferred embodiment. Read channel 700' is preferably fabricated as an integrated circuit. As shown therein, linear block code encoder is implemented as a LDPC encoder 304', soft channel decoder is implemented as a bi-direction Viterbi algorithm (BIVA) decoder 504' or BIVA decoding means, and soft linear block code decoder is implemented as an LDPC decoder 506' or LDPC decoding means. LDPC decoder 506' employs the "sum product" method. In the best mode of the preferred embodiment, the number of iterations in step S650 n is 5. Preferably, the number of bits is either 1210 or 1173 and the number of parity check equations is 105 or 68, respectively. If the number of parity equations is 105, the threshold in step S655, x is 12, or if the number of parity equations is 68 then x is 8.

FIG. 9 is a flowchart illustrating the operation of the read channel in FIG. 7. As noted above, the output of read head 408, which is an analog signal, is converted to a digital signal in step S615 by analog to digital decoder 502. The counter N is set to 1 in step S620. The digital signal is then decoded using the bi-directional Viterbi algorithm (BIVA) by BIVA decoder 504' in step S625. After the first BIVA decoding process the results are saved in a buffer memory, otherwise the results thereof are not saved (steps S630 and S640).

The results of the BIVA decoder 504' are then LDPC decoded by LDPC decoder 506' or LDPC decoding means, step S640. In step S650, the parity check equations are calculated to determine if there are any violations. If there are no violations or if the number of iterations N is equal to 5, then processing continues to step S655; otherwise N is incremented by 1 and the next iteration of processing is performed.

In step S655 threshold detector 510 determines if the number of violations is greater than x. For the case where there are 1210 bits of data are processed in a time period, there are 105 parity check equations. As will be understood by one of ordinary skill in the art, the matrix is sized 1210×105. For this case, if the number of violations is greater than 12, then the output is set to the output of the BIVA decoder 504' at N=1, which was previously saved in step S635. Alternatively, if the number of violations is not greater than 12, the output is set to the output of the LDPC decoding, step S665. Similarly for the case where 1173 bits are processed in a time period, there are 68 parity check equations which corresponds to an 1173×68 matrix. With this size matrix, if the number of violations is greater than 8 then the output is set to the output of the BIVA decoder 504' at N=1, which was previously saved in step S635. In either case, the output is then RLL decoded in step S670.

Figure 6A:
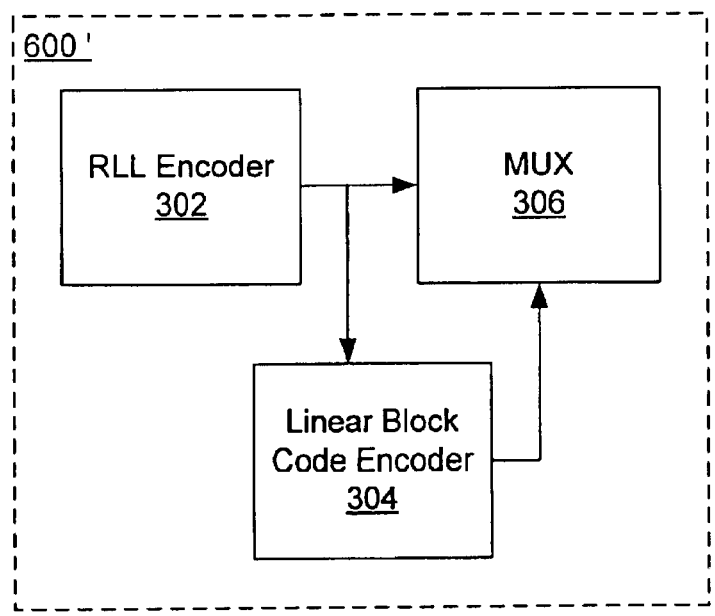
FIG. 6A is a block diagram of another encoder in accordance with an embodiment of the present invention.

FIG. 6A shows an alternate encoder 600' in accordance with a preferred embodiment of the present invention. As shown therein, the input signal is RLL encoded by RLL encoder 302 which is then linear block code encoded by linear block code encoder 304 to generate parity data. The outputs of both the RLL encoder 302 and linear block code encoder 304 are then combined by multiplexer 306 or multiplexing means.

While the invention has been described in conjunction with several specific embodiments, it is evident to those skilled in the art that many further alternatives, modifications and variations will be apparent in light of the foregoing description. More specifically, while the read channel of the present invention is implemented as an integrated circuit, it is contemplated that the present invention may also be implemented as discrete components or a general-purpose processor operated in accordance with program code instructions or computer program or combination thereof. These program code instructions can be obtain from a medium, such as network, local area network, the Internet, or storage devices. Such storage devices include, by way of example, magnetic storage devices, optical storage devices, electronic storage devices, magneto-optical device and the like. Moreover, as will be appreciated by one of ordinary skill in the art, while a number of examples have shown being utilized with mass storage systems, the same encoder and decoder circuits and methods may also be utilized with data transmission systems. As such, apparatuses and techniques discussed with the preferred embodiments are just as applicable with data transmissions systems. Thus, the invention described herein is intended to embrace all such alternatives, modifications, applications and variations as may fall within the spirit and scope of the appended claims.

What is claimed is:

1. A storage system for storing data on a storage medium, comprising:
    an encoder to encode data;
    a linear block encoder to encode data encoded by said encoder;
    a write circuit to write an output of said linear block encoder to the storage medium;
    a read circuit to read data from the storage medium;
    a soft channel decoder to decode data;
    a soft linear block code decoder to decode data decoded by said soft channel decoder,
        wherein in a first iteration, said soft channel decoder decodes the data read by said read circuit,
        wherein in a succeeding iteration, said soft channel decoder decodes the data read by said read circuit and utilizes information decoded by said soft linear block decoder from an immediately preceding iteration;
    a threshold check circuit to select
        an output of said soft linear block code decoder if a number of parity-check violations is less than a threshold, or
        an output of said soft channel decoder if a number of violations is greater than the threshold; and
    a decoder to decode an output of said threshold check circuit.

2. A storage system according to claim 1, wherein said encoder comprises a run length limited encoder and said decoder comprises a run length limited decoder.

3. A storage system according to claim 1, wherein said linear block code encoder comprises a low-density parity-check encoder and wherein said soft linear block code decoder comprises a low-density parity-check decoder.

4. A storage system according to claim 1, wherein said soft channel decoder comprises a bi-directional Viterbi algorithm decoder.

5. A storage system according to claim 1, wherein if there is a parity-check violation at an output of said soft linear block code decoder, said soft channel decoder utilizes the information of said soft linear block code decoder.

6. A storage system according to claim 1, wherein if there are no parity-check violations or a number of iterations exceeds a predetermined number then said threshold check circuit determines if the number of parity-check violations is less than the threshold.

7. A storage system according to claim 6, wherein the predetermined number is five.

8. A storage system according to claim 1, wherein the threshold is 12.

9. A storage system according to claim 1, wherein the threshold is 8.

10. A storage system according to claim 1, wherein said soft linear block code decoder utilizes a parity-check matrix to determine if there is a parity-check violation.

11. A storage system according to claim 1, further comprising a multiplexer in communication with said encoder and said linear block encoder and provides an output to said write circuit.

12. A read channel for reading data stored on a storage medium, comprising:
    a soft channel decoder to decode data stored on the storage medium;
    a soft linear block code decoder to decode data decoded by said soft channel decoder,
        wherein in a first iteration, said soft channel decoder decodes the data stored on the storage medium,
        wherein in a succeeding iteration, said soft channel decoder decodes the data stored on the storage medium and utilizes information decoded by said soft linear block decoder from an immediately preceding iteration; and
    a threshold check circuit to select
        an output of said soft linear block code decoder if a number of parity-check violations is less than a threshold, or
        an output of said soft channel decoder if a number of violations is greater than the threshold.

13. A read channel according to claim 12, further comprising a decoder to decode an output of said threshold check circuit.

14. A read channel according to claim 12, wherein said soft linear block code decoder comprises a low-density parity-check decoder.

15. A read channel according to claim 12, wherein said soft channel decoder comprises a bi-directional Viterbi algorithm decoder.

16. A read channel according to claim 12, wherein if there is a parity-check violation at an output of said soft linear block code decoder, said soft channel decoder utilizes the information of said soft linear block code decoder.

17. A read channel according to claim 12, wherein if there are no parity-check violations or a number of iterations exceeds a predetermined number then said threshold check circuit determines if the number of parity-check violations is less than the threshold.

18. A read channel according to claim 17, wherein the predetermined number is five.

19. A read channel according to claim 12, wherein the threshold is 12.

20. A read channel according to claim 12, wherein the threshold is 8.

21. A read channel according to claim 12, wherein said soft linear block code decoder utilizes a parity-check matrix to determine if there is a parity-check violation.

22. A read channel according to claim 13, wherein said decoder comprises a run length limited decoder.

23. A storage system for storing data on a storage medium, comprising:
    encoder means for encoding data;
    linear block encoder means for encoding data encoded by said encoder means;
    data writing means for writing an output of said linear block encoder means to the storage medium;
    data reading means for reading data from the storage medium;
    soft channel decoding means for decoding data;
    soft linear block code decoding means for decoding data decoded by said soft channel decoding means,
        wherein in a first iteration, said soft channel decoding means decodes the data read by said data reading means,
        wherein in a succeeding iteration, said soft channel decoding means decodes the data read by said data reading means and utilizes information decoded by said soft linear block decoding means from an immediately preceding iteration;
threshold determining means for selecting
an output of said soft linear block code decoding means if a number of parity-check violations is less than a threshold, or
an output of said soft channel decoding means if a number of violations is greater than the threshold; and
decoding means for decoding an output of said threshold determining means.

24. A storage system according to claim 23, wherein said encoder means comprises an run length limited encoder means for performing a run length limited encoding and said decoding means comprise a run length limited decoding means for performing a run length limited decoding.

25. A storage system according to claim 23, wherein said linear block code encoder means comprises a low-density parity-check encoder means for encoding parity information and wherein said soft linear block code decoding means comprises a low-density parity-check decoding means for decoding parity information.

26. A storage system according to claim 23, wherein said soft channel decoding means comprises a bi-directional Viterbi algorithm decoding means for performing a bi-directional Viterbi algorithm decoding.

27. A storage system according to claim 23, wherein if there is a parity-check violation at an output of said soft linear block code decoding means, said soft channel decoding means utilizes the information of said soft linear block code decoding means.

28. A storage system according to claim 23, wherein if there are no parity-check violations or a number of iterations exceeds a predetermined number then said threshold determining means determines if the number of parity-check violations is less than the threshold.

29. A storage system according to claim 28, wherein the predetermined number is five.

30. A storage system according to claim 23, wherein the threshold is 12.

31. A storage system according to claim 23, wherein the threshold is 8.

32. A storage system according to claim 23, wherein said soft linear block code decoding means utilizes a parity-check matrix to determine if there is a parity-check violation.

33. A storage system according to claim 23, further comprising a multiplexing means for combining outputs of said encoder means and said linear block encoder means as an input to said data writing means.

34. A read channel for reading data stored on a storage medium, comprising:
soft channel decoding means for decoding data stored on the storage medium;
soft linear block code decoding means for decoding data decoded by said soft channel decoding means,
wherein in a first iteration, said soft channel decoding means decodes the data stored on the storage medium,
wherein in a succeeding iteration, said soft channel decoding means decodes the data stored on the storage medium and utilizes information decoded by said soft linear block decoding means from an immediately preceding iteration; and
threshold determining means for selecting
an output of said soft linear block code decoding means if a number of parity-check violations is less than a threshold, or
an output of said soft channel decoding means if a number of violations is greater than the threshold.

35. A read channel according to claim 34, further comprising a decoding means for decoding an output of said threshold determining means.

36. A read channel according to claim 34, wherein said soft linear block code decoding means comprises a low-density parity-check decoding means for decoding parity information.

37. A read channel according to claim 34, wherein said soft channel decoding means comprises a bi-directional Viterbi algorithm decoding means for performing a bidirectional Viterbi algorithm decoding.

38. A read channel according to claim 34, wherein if there is a parity-check violation at an output of said soft linear block code decoding means, said soft channel decoding means utilizes the information of said soft linear block code decoding means.

39. A read channel according to claim 34, wherein if there are no parity-check violations or a number of iterations exceeds a predetermined number then said threshold determining means determines if the number of parity-check violations is less than the threshold.

40. A read channel according to claim 39, wherein the predetermined number is five.

41. A read channel according to claim 34, wherein the threshold is 12.

42. A read channel according to claim 34, wherein the threshold is 8.

43. A read channel according to claim 34, wherein said soft linear block code decoding means utilizes a parity-check matrix to determine if there is a parity-check violation.

44. A read channel according to claim 35, wherein said decoding means comprises a run length limited decoding means for performing a run length limited decoding.

45. A method for storing data on and reading data from a storage medium, comprising the steps of:
(a) encoding the data to be stored on the storage medium;
(b) linear block encoding the data encoded in step (a);
to the storage medium;
(d) reading the data from the storage medium;
(e) soft channel decoding the data read in step (d);
(f) soft linear block code decoding the data decoded in step (e),
wherein in a first iteration, step (e) decodes the data read in step (d)
wherein in a succeeding iteration, step (e) decodes the data read in step (d) and utilizes information decoded from step (f) from an immediately preceding iteration;
(g) calculating a number of parity-check violations from step (f);
(h) selecting
the data decoded in step (e) if a number of parity-check violations is less than a threshold, or
the data decoded in step (f) if a number of violations is greater than the threshold; and
(i) decoding the data selected in step (h).

46. A method according to claim 45, wherein step (a) comprises the step of run length limited encoding and wherein step (i) comprises the step of run length limited decoding.

47. A method according to claim 45, wherein step (b) comprises the step of low-density parity-check encoding and wherein step (f) comprises the step of low-density parity-check decoding.

48. A method according to claim 45, wherein step (e) comprises the step of bi-directional Viterbi algorithm decoding.

49. A method according to claim 45, wherein in step (g), if there is a parity-check violation, step (e) utilizes the information from step (f).

50. A method according to claim 45, further comprising the step (j) determining a number of iterations of steps (e) and (f), wherein in step (g), if there are no parity-check violations or the number of iterations determined in step (j) exceeds a predetermined number, then step (g) determines if the number of parity-check violations is less than the threshold.

51. A method according to claim 50, wherein the predetermined number is five.

52. A method according to claim 45, wherein the threshold is 34.

53. A method according to claim 45, wherein the threshold is 8.

54. A method according to claim 45, wherein step (g) utilizes a parity-check matrix to determine if there is a parity-check violation.

55. A method according to claim 45, further comprising the step of multiplexing outputs of steps (a) and (b).

56. A method for decoding data read from a storage medium, comprising the steps of:
   (a) soft channel decoding the data read from the storage medium;
   (b) soft linear block code decoding the data decoded in step (a),
      wherein in a first iteration, step (a) decodes the data read from the storage medium,
      wherein in a succeeding iteration, step (a) decodes the data from the storage medium and utilizes information decoded from step (b) from an immediately preceding iteration; and
   (c) calculating a number of parity-check violations from step (b);
   (d) selecting
      the data decoded in step (a) if a number of parity-check violations is less than a threshold, or
      the data decoded in step (b) if a number of violations is greater than the threshold.

57. A method according to claim 56, further comprising step (e) decoding the data selected in step (d).

58. A method according to claim 56, wherein step (b) comprises the step of low-density parity-check decoding.

59. A method according to claim 56, wherein step (a) comprises the step of bi-directional Viterbi algorithm decoding.

60. A method according to claim 56, wherein in step (c), if there is a parity-check violation, step (a) utilizes the information from step (b).

61. A method according to claim 56, further comprising the step (f) determining a number of iterations of steps (a) and (b), wherein in step (c), if there are no parity-check violations or the number of iterations determined in step (f) exceeds a predetermined number then step (c) determines if the number of parity-check violations is less than the threshold.

62. A method according to claim 61, wherein the predetermined number is five.

63. A method according to claim 56, wherein the threshold is 34.

64. A method according to claim 56, wherein the threshold is 8.

65. A method according to claim 56, wherein step (c) utilizes a parity-check matrix to determine if there is a parity-check violation.

66. A method according to claim 57, wherein step (e) comprises the step of run length limited decoding.

67. A computer program embodied in a medium for storing data on and reading data from a storage medium, the computer program comprising the steps of:
   (a) encoding the data to be stored on the storage medium;
   (b) linear block encoding the data encoded in step (a);
   to the storage medium;
   (d) reading the data from the storage medium;
   (e) soft channel decoding the data read in step (d);
   (f) soft linear block code decoding the data decoded in step (e),
      wherein in a first iteration, step (e) decodes the data read in step (d)
      wherein in a succeeding iteration, step (e) decodes the data read in step (d) and utilizes information decoded from step (f) from an immediately preceding iteration;
   (g) calculating a number of parity-check violations from step (f);
   (h) selecting
      the data decoded in step (e) if a number of parity-check violations is less than a threshold, or
      the data decoded in step (f) if a number of violations is greater than the threshold; and
   (i) decoding the data selected in step (h).

68. A computer program according to claim 67, wherein step (a) comprises the step of run length limited encoding and wherein step (i) comprises the step of run length limited decoding.

69. A computer program according to claim 67, wherein step (b) comprises the step of low-density parity-check encoding and wherein step (f) comprises the step of low-density parity-check decoding.

70. A computer program according to claim 67, wherein step (e) comprises the step of bi-directional Viterbi algorithm decoding.

71. A computer program according to claim 67, wherein in step (g), if there is a parity-check violation, step (e) utilizes the information from step (f).

72. A computer program according to claim 67, further comprising the step (j) determining a number of iterations of steps (e) and (f), wherein in step (g), if there are no parity-check violations or the number of iterations determined in step (j) exceeds a predetermined number, then step (g) determines if the number of parity-check violations is less than the threshold.

73. A computer program according to claim 72, wherein the predetermined number is five.

74. A computer program according to claim 67, wherein the threshold is 34.

75. A computer program according to claim 67, wherein the threshold is 8.

76. A computer program according to claim 67, wherein step (g) utilizes a parity-check matrix to determine if there is a parity-check violation.

77. A computer program according to claim 67, further comprising the step of multiplexing outputs of steps (a) and (b).

78. A computer program embodied in a medium for decoding data read from a storage medium, the computer program comprising the steps of:
   (a) soft channel decoding the data read from the storage medium;
   (b) soft linear block code decoding the data decoded in step (a), wherein in a first iteration, step (a) decodes the data read from the storage medium, wherein in a succeeding iteration, step (a) decodes the data from the storage medium and utilizes information decoded from step (b) from an immediately preceding iteration; and (c) calculating a number of parity-check violations from step (b);

(d) selecting the data decoded in step (a) if a number of parity-check violations is less than a threshold, or the data decoded in step (b) if a number of violations is greater than the threshold.

79. A computer program according to claim 78, further comprising step (e) decoding the data selected in step (d).

80. A computer program according to claim 78, wherein step (b) comprises the step of low-density parity-check decoding.

81. A computer program according to claim 78, wherein step (a) comprises the step of bidirectional Viterbi algorithm decoding.

82. A computer program according to claim 78, wherein in step (c), if there is a parity-check violation, step (a) utilizes the information from step (b).

83. A computer program according to claim 78, further comprising the step (f) determining a number of iterations of steps (a) and (b), wherein in step (c), if there are no parity-check violations or the number of iterations determined in step (f) exceeds a predetermined number then step (c) determines if the number of parity-check violations is less than the threshold.

84. A computer program according to claim 82, wherein the predetermined number is five.

85. A computer program according to claim 78, wherein the threshold is 34.

86. A computer program according to claim 78, wherein the threshold is 8.

87. A computer program according to claim 78, wherein step (c) utilizes a parity-check matrix to determine if there is a parity-check violation.

88. A computer program according to claim 79, wherein step (e) comprises the step of run length limited decoding.

89. A data transmission system for transmitting data to and receiving data from a communication channel, comprising:

an encoder to encode data;

a linear block encoder to encode data encoded by said encoder;

a transmitter to transmit an output of said linear block encoder to the communication channel;

a soft channel decoder to decode data;

a soft linear block code decoder to decode data decoded by said soft channel decoder, wherein in a first iteration, said soft channel decoder decodes the data from the communication channel, wherein in a succeeding iteration, said soft channel decoder decodes the data read by a read circuit and utilizes information decoded by said soft linear block decoder from an immediately preceding iteration;

a decision circuit to select an output of said soft linear block code decoder if an evaluated criterion is less than a threshold, or an output of said soft channel decoder if the evaluated criterion is greater than the threshold; and a decoder to decode an output of said decision circuit.

90. A data transmission system according to claim 89, wherein said encoder comprises a run length limited encoder and said decoder comprises a run length limited decoder.

91. A data transmission system according to claim 89, wherein said linear block code encoder comprises a low-density parity-check encoder and wherein said soft linear block code decoder comprises a low-density parity-check decoder.

92. A data transmission system according to claim 89, wherein said soft channel decoder comprises a bi-directional Viterbi algorithm decoder.

93. A data transmission system according to claim 89, wherein if the evaluated criterion is greater than a predetermined threshold, said soft channel decoder utilizes the information of said soft linear block code decoder.

94. A data transmission system according to claim 89, wherein if the evaluated criterion is satisfied or a number of iterations exceeds a predetermined number then said decision circuit determines if the evaluated criterion is greater than a predetermined threshold.

95. A data transmission system according to claim 94, wherein the predetermined number is five.

96. A data transmission system according to claim 89, wherein the evaluated criterion is selected from the group consisting of signal to noise ratio and parity check equations.

97. A data transmission system according to claim 89, wherein the evaluated criterion comprises parity check equations, and wherein said soft linear block code decoder utilizes a parity-check matrix to determine if there is a parity-check violation.

98. A data transmission system according to claim 89, further comprising a multiplexer in communication with said encoder and said linear block encoder and provides an output to said transmitter.

99. A decoder for decoding data from a communication channel, comprising:

a soft channel decoder to decode data from the communication channel;

a soft linear block code decoder to decode data decoded by said soft channel decoder, wherein in a first iteration, said soft channel decoder decodes the data from the communication channel, wherein in a succeeding iteration, said soft channel decoder decodes from the communication channel and utilizes information decoded by said soft linear block decoder from an immediately preceding iteration; and a decision circuit to select an output of said soft linear block code decoder if an evaluated criterion is less than a threshold, or an output of said soft channel decoder if the evaluated criterion is greater than the threshold.

100. A decoder according to claim 99, further comprising a decoding circuit to decode an output of said decision circuit.

101. A decoder according to claim 99, wherein said soft linear block code decoder comprises a low-density parity-check decoder.

102. A decoder according to claim 99, wherein said soft channel decoder comprises a bidirectional Viterbi algorithm decoder.

103. A decoder according to claim 99, wherein if the evaluated criterion is greater than a predetermined threshold, said soft channel decoder utilizes the information of said soft linear block code decoder.

104. A decoder according to claim 99, wherein if the evaluated criterion is satisfied or a number of iterations exceeds a predetermined number then said decision circuit determines if the evaluated criterion is greater than a predetermined threshold.

105. A decoder according to claim 104, wherein the predetermined number is five.

106. A data transmission system according to claim 99, wherein the evaluated criterion is selected from the group consisting of signal to noise ratio and parity check equations.

107. A decoder according to claim 99, wherein the evaluated criterion comprise parity check equations, and wherein said soft linear block code decoder utilizes a parity-check matrix to determine if there is a parity-check violation.

108. A decoder according to claim 100, wherein said decoding circuit comprises a run length limited decoder.

109. A data transmission system for transmitting data to and receiving data from a communication channel,
- encoder means for encoding data;
- linear block encoder means for encoding data encoded by said encoder means;
- transmitting means for transmitting an output of said linear block encoder means to the communication channel;
- soft channel decoding means for decoding data from the communication channel;
- soft linear block code decoding means for decoding data decoded by said soft channel decoding means,
  - wherein in a first iteration, said soft channel decoding means decodes the data from the communication channel,
  - wherein in a succeeding iteration, said soft channel decoding means decodes the data from the communication channel and utilizes information decoded by said soft linear block decoding means from an immediately preceding iteration;
- decision means for selecting
  - an output of said soft linear block code decoding means if an evaluated criterion is less than a threshold, or
  - an output of said soft channel decoding means if the evaluated criterion is greater than the threshold; and
- decoding means for decoding an output of said decision means.

110. A data transmission system according to claim 109, wherein said encoder means comprises an run length limited encoder means for performing a run length limited encoding and said decoding means comprises a run length limited decoding means for performing a run length limited decoding.

111. A data transmission system according to claim 109, wherein said linear block code encoder means comprises a low-density parity-check encoder means for encoding parity information and wherein said soft linear block code decoding means comprises a low-density parity-check decoding means for decoding parity information.

112. A data transmission system according to claim 109, wherein said soft channel decoding means comprises a bi-directional Viterbi algorithm decoding means for performing a bi-directional Viterbi algorithm decoding.

113. A data transmission system according to claim 112, wherein if the evaluated criterion is greater than a predetermined threshold, said soft channel decoding means utilizes the information of said soft linear block code decoding means.

114. A data transmission system according to claim 112, wherein if the evaluated criterion is satisfied or a number of iterations exceeds a predetermined number then said decision means determines if the evaluated criterion is greater than a predetermined threshold.

115. A data transmission system according to claim 109, wherein the predetermined number is five.

116. A data transmission system according to claim 109, wherein the evaluated criterion is selected from the group consisting of signal to noise ratio and parity check equations.

117. A data transmission system according to claim 109, wherein the evaluated criterion comprises parity check equations, and wherein said soft linear block code decoding means utilizes a parity-check matrix to determine if there is a parity-check violation.

118. A data transmission system according to claim 109, further comprising a multiplexing means for combining outputs of said encoder means and said linear block encoder means as an input to a data writing means.

119. A decoder for decoding data from a communication channel, comprising:
- soft channel decoding means for decoding data from the communication channel;
- soft linear block code decoding means for decoding data decoded by said soft channel decoding means,
  - wherein in a first iteration, said soft channel decoding means decodes the data from the communication channel,
  - wherein in a succeeding iteration, said soft channel decoding means decodes the data from the communication channel and utilizes information decoded by said soft linear block decoding means from an immediately preceding iteration; and
- decision means for selecting
  - an output of said soft linear block code decoding means if an evaluated criterion is less than a threshold, or
  - an output of said soft channel decoding means if the evaluated criterion is greater than the threshold.

120. A decoder according to claim 119, further comprising a decoding means for decoding an output of said decision means.

121. A decoder according to claim 119, wherein said soft linear block code decoding means comprises a low-density parity-check decoding means for decoding parity information.

122. A decoder according to claim 119, wherein said soft channel decoding means comprises a bi-directional Viterbi algorithm decoding means for performing a bi-directional Viterbi algorithm decoding.

123. A decoder according to claim 119, wherein if the evaluated criterion is greater than a predetermined threshold, said soft channel decoding means utilizes the information of said soft linear block code decoding means.

124. A decoder according to claim 119, wherein if the evaluated criterion is satisfied or a number of iterations exceeds a predetermined number then said decision means determines if the evaluated criterion is greater than a predetermined threshold.

125. A decoder according to claim 124, wherein the predetermined number is five.

126. A decoder according to claim 119, wherein the evaluated criterion is selected from the group consisting of signal to noise ratio and parity check equations.

127. A decoder according to claim 119, wherein the evaluated criterion comprises parity check equations, and wherein said soft linear block code decoding means utilizes a parity-check matrix to determine if there is a parity-check violation.

128. A decoder according to claim 120, wherein said decoding means comprises a run length limited decoding means for performing a run length limited decoding.

129. A method for transmitting data to and receiving data from a communication channel, comprising the steps of:
(a) encoding the data to be transmitted to the communication channel;

(b) linear block encoding the data encoded in step (a);
(c) transmitting the data form to the communication channel;
(d) receiving the data from to the communication channel;
(e) soft channel decoding the data read in step (d);
(f) soft linear block code decoding the data decoded in step (e),
  wherein in a first iteration, step (e) decodes the data received in step (d)
  wherein in a succeeding iteration, step (e) decodes the data received in step (d) and utilizes information decoded from step (f) from an immediately preceding iteration;
(g) selecting
  the data decoded in step (e) if an evaluated criterion is less than a threshold, or
  the data decoded in step (f) if the evaluated criterion is greater than the threshold; and
(h) decoding the data selected in step (g).

130. A method according to claim 129, wherein step (a) comprises the step of run length limited encoding and wherein step (h) comprises the step of run length limited decoding.

131. A method according to claim 129, wherein step (b) comprises the step of low-density parity-check encoding and wherein step (f) comprises the step of low-density parity-check decoding.

132. A method according to claim 129, wherein step (e) comprises the step of bi-directional Viterbi algorithm decoding.

133. A method according to claim 129, wherein in step (g), if the evaluated criterion is greater than the predetermined threshold, step (e) utilizes the information from step (f).

134. A method according to claim 129, further comprising the step (i) determining a number of iterations of steps (e) and (f), wherein in step (g), if the evaluated criterion is satisfied or the number of iterations determined in step (i) exceeds a predetermined number, then step (g) determines if the evaluated criterion is greater than the predetermined threshold.

135. A method according to claim 134, wherein the predetermined number is five.

136. A method according to claim 129, wherein the evaluated criterion is selected from the group consisting of signal to noise ratio and parity check equations.

137. A method according to claim 129, wherein the evaluated criterion comprises parity check equations, and wherein step (g) utilizes a parity-check matrix to determine if there is a parity-check violation.

138. A method according to claim 129, further comprising the step of multiplexing outputs of steps (a) and (b).

139. A method for decoding data received from a communication channel, comprising the steps of:
(a) soft channel decoding the data read from the communication channel;
(b) soft linear block code decoding the data decoded in step (a),
  wherein in a first iteration, step (a) decodes the data read from the storage medium,
  wherein in a succeeding iteration, step (a) decodes the data from the storage medium and utilizes information decoded from step (b) from an immediately preceding iteration; and
(c) selecting
  the data decoded in step (a) if an evaluated criterion is less than a threshold, or
  the data decoded in step (b) if the evaluated criterion is greater than the threshold.

140. A method according to claim 139, further comprising step (d) decoding the data selected in step (c).

141. A method according to claim 139, wherein step (b) comprises the step of low-density parity-check decoding.

142. A method according to claim 139, wherein step (a) comprises the step of bi-directional Viterbi algorithm decoding.

143. A method according to claim 139, wherein in step (c), if the evaluated criterion is greater than the predetermined threshold, step (a) utilizes the information from step (b).

144. A method according to claim 139, further comprising step (d) determining a number of iterations of steps (a) and (b), wherein in step (c), if the evaluated criterion is satisfied or the number of iterations determined in step (b) exceeds a predetermined number then step (c) determines if the evaluated criterion is greater than the threshold.

145. A method according to claim 144, wherein the predetermined number is five.

146. A method according to claim 139, wherein the evaluated criterion is selected from the group consisting of signal to noise ratio and parity check equations.

147. A method according to claim 139, wherein the evaluated criterion comprises parity check equations, and wherein step (c) utilizes a parity-check matrix to determine if there is a parity-check violation.

148. A method according to claim 140, wherein step (d) comprises the step of run length limited decoding.

149. A computer program embodied in a medium for transmitting data to and receiving data from a communication channel, the computer program comprising the steps of:
(a) encoding the data to be transmitted to the communication channel;
(b) linear block encoding the data encoded in step (a);
(c) transmitting the data form to the communication channel;
(d) receiving the data from to the communication channel;
(e) soft channel decoding the data read in step (d);
(f) soft linear block code decoding the data decoded in step (e),
  wherein in a first iteration, step (e) decodes the data received in step (d)
  wherein in a succeeding iteration, step (e) decodes the data received in step (d) and utilizes information decoded from step (f) from an immediately preceding iteration;
(g) selecting
  the data decoded in step (e) if an evaluated criterion is less than a threshold, or
  the data decoded in step (f) if the evaluated criterion is greater than the threshold; and
(h) decoding the data selected in step (g).

150. A computer program according to claim 149, wherein step (a) comprises the step of run length limited encoding and wherein step (h) comprises the step of run length limited decoding.

151. A computer program according to claim 149, wherein step (b) comprises the step of low-density parity-check encoding and wherein step (f) comprises the step of low-density parity-check decoding.

152. A computer program according to claim 149, wherein step (e) comprises the step of bi-directional Viterbi algorithm decoding.

153. A computer program according to claim 149, wherein in step (g), if the evaluated criterion is greater than the predetermined threshold step (e) utilizes the information from step (f).

154. A computer program according to claim 149, further comprising the step (i) determining a number of iterations of steps (e) and (f), wherein in step (g), if the evaluated criteria is satisfied or the number of iterations determined in step (i) exceeds a predetermined number, then step (g) determines if the evaluated criterion is greater than the threshold.

155. A computer program according to claim 154, wherein the predetermined number is five.

156. A computer program according to claim 149, wherein the evaluated criterion is selected from the group consisting of signal to noise ratio and parity check equations.

157. A computer program according to claim 149, wherein the evaluated comprises parity check equations, and wherein step (g) utilizes a parity-check matrix to determine if there is a parity-check violation.

158. A computer program according to claim 149, further comprising the step of multiplexing outputs of steps (a) and (b).

159. A computer program embodied in a medium for decoding data received from a communication channel, the computer program comprising the steps of:
- (a) soft channel decoding the data read from the communication channel;
- (b) soft linear block code decoding the data decoded in step (a),
  - wherein in a first iteration, step (a) decodes the data read from the communication channel,
  - wherein in a succeeding iteration, step (a) decodes the data from the communication channel and utilizes information decoded from step (b) from an immediately preceding iteration; and
- (c) selecting
  - the data decoded in step (a) if an evaluated criterion is less than a threshold, or
  - the data decoded in step (b) if the evaluated criterion is greater than the threshold.

160. A computer program according to claim 159, further comprising step (d) decoding the data selected in step (e).

161. A computer program according to claim 159, wherein step (b) comprises the step of low-density parity-check decoding.

162. A computer program according to claim 159, wherein step (a) comprises the step of bi-directional Viterbi algorithm decoding.

163. A computer program according to claim 159, wherein in step (c), if the evaluated criterion is greater than the predetermined threshold, step (a) utilizes the information from step (b).

164. A computer program according to claim 159, further comprising step (d) determining a number of iterations of steps (a) and (b), wherein in step (c), if the evaluated criterion is satisfied or the number of iterations determined in step (d) exceeds a predetermined number then step (c) determined in step determines if the evaluated criterion is greater than the threshold.

165. A computer program according to claim 164, wherein the predetermined number is five.

166. A computer program according to claim 159, wherein the evaluated criterion is selected from the group consisting of signal to noise ratio and parity check equations.

167. A computer program according to claim 159, wherein the evaluated criteria comprises parity check equations, and wherein step (c) utilizes a parity-check matrix to determine if there is a parity-check violation.

168. A computer program according to claim 160, wherein step (d) comprises the step of run length limited decoding.

* * * * *